United States Patent [19]

Brauer

[11] Patent Number: 4,646,204
[45] Date of Patent: Feb. 24, 1987

[54] HOLE GEOMETRY FOR PRINTED CIRCUIT BOARDS

[75] Inventor: Eric A. Brauer, Danville, Ind.

[73] Assignee: RCA Corporation, Princeton, N.J.

[21] Appl. No.: 827,705

[22] Filed: Feb. 10, 1986

[51] Int. Cl.$^4$ .............................................. H05K 1/18
[52] U.S. Cl. .................................. 361/403; 339/17 C; 339/221 R; 361/405
[58] Field of Search .............. 174/68.5; 361/397–398, 361/400–401, 405–406, 410, 403; 339/17 C, 221 R

[56] References Cited

U.S. PATENT DOCUMENTS

| | | | |
|---|---|---|---|
| 3,290,558 | 12/1966 | Sapy | 361/410 |
| 3,562,591 | 2/1971 | Schmidt | 361/406 X |
| 3,601,750 | 8/1971 | Mancini | 174/68.5 X |
| 3,621,445 | 11/1971 | Horecky | 174/68.5 X |
| 3,673,543 | 6/1972 | Garner | 174/138 G X |
| 3,702,422 | 11/1972 | Schor | 361/405 |
| 4,288,840 | 9/1981 | Konishikawa et al. | 361/406 X |
| 4,339,784 | 7/1982 | Shearer | 361/403 |
| 4,345,301 | 8/1982 | Nelson | 361/405 X |
| 4,377,321 | 3/1983 | Wersenburger | 339/17 C X |
| 4,503,611 | 3/1985 | Sampson et al. | 29/845 |

Primary Examiner—Arthur T. Grimley
Assistant Examiner—Jane K. Lau
Attorney, Agent, or Firm—Paul J. Rasmussen; Eric P. Herrmann; Dilip A. Kulkarni

[57] ABSTRACT

The printed circuit board (PCB) is provided with a plurality of square connector stakes, which are pressed into the respective holes disposed in the PCB. The connector stake holes are arranged on the PCB such that a conductive pad encircles each of the connector holes. The connector holes have a cross-section that provides the required mechanical interference between the connector stakes and the connector holes to hold the stakes in place prior to soldering. At the same time, the walls of the holes are configured to limit the flux from migrating to the upper portions of the connector stakes during the wave soldering operation.

8 Claims, 3 Drawing Figures

HOLE GEOMETRY FOR PRINTED CIRCUIT BOARDS

This invention relates generally to the printed circuit board assembly techniques.

BACKGROUND

One of the methods of electrically interconnecting a printed circuit board to other electronic system components, is to insert one or more longitudinal conductive stakes into the printed circuit board (PCB) substantially normal to the board surface. The stakes are connected electrically to circuit elements on the PCB. Wire harness or ribbon cables, for example, equipped with female end connectors are slipped over the stakes to make connection between the PCB and the other system components.

During PCB assembly, the conductive connector stakes, which typically have a rectangular cross section, are inserted into round holes in the PCB. On one side of the PCB, designated herein as the underside, the holes are each circumscribed by a metallic conductor. The diameter of the holes is designed to be smaller than the diagonal distance between the corners of the stakes to provide mechanical interference between the stakes and the PCB. The mechanical interference temporarily secures the stakes to the PCB prior to soldering.

Soldering is performed by a wave soldering machine. In this machine the underside of the PCB is first exposed to flux which conditions the PCB metallic conductors and the stakes for soldering. The underside of the PCB is then applied to a solder bath and the stakes are soldered to the metallic conductors circumscribing the respective holes, permanently securing the stakes to the PCB and making electrical contact with the elements on the PCB.

It has been determined that flux, applied to the underside of the PCB, will seep or wick up in the spaces between the round holes and rectangular stakes. In fact, the flux may cover the entire stakes. Since the flux is generally non conductive, it may prevent connectors subsequently inserted over the stakes from establishing electrical contact with the stakes.

It is not desirable to provide the PCB with rectangular holes to prevent the flux from wicking up to the upper parts of the stakes. If there is too much interference between the rectangular stakes and the rectangular holes, the PCB develops cracks. On the other hand, if there is too little interference between them, the stakes tend to slip out of the holes in the PCB during handling operations prior to soldering.

It is of course possible to cover the gap between the flat sides of the rectangular stakes and the round edges of the holes with a plastic header strip disposed on the top or component side of the PCB to prevent the flux from migrating to the upper end of the stakes. Another solution to this problem is to provide the stakes with collars to block the flux from contaminating the upper portions of the stakes. Both of these solutions are not cost effective, because they entail additional labor and material costs.

SUMMARY OF INVENTION

The present invention includes a printed circuit board having provision for receiving substantially rectangular connector stakes. The printed circuit board is provided with stake receiving holes having a geometry substantially conformal with the rectangular cross section of the connector stakes. The corners of the receiving holes are chamfered, and the holes are dimensioned so that only the chamfered corners provide significant mechanical interference with the stakes and the peripheral stake-hole spacing precludes substantial wicking of the flux.

IN THE DRAWINGS

FIG. 1 illustrates an enlarged perspective view of a portion of a printed circuit board (PCB) having improved-geometry connector stake holes in accordance with the present invention; also shown therein are a plurality of square connector stakes and a connector plug having an equal plurality of slots therein for engaging the respective stakes; and FIGS. 2 and 3 respectively depict an exaggerated cross-sectional side view and a corresponding top plan view of the FIG. 1 PCB, showing one of the connector stakes and an improved-geometry hole therefor.

DETAILED DESCRIPTION

Figure 1:
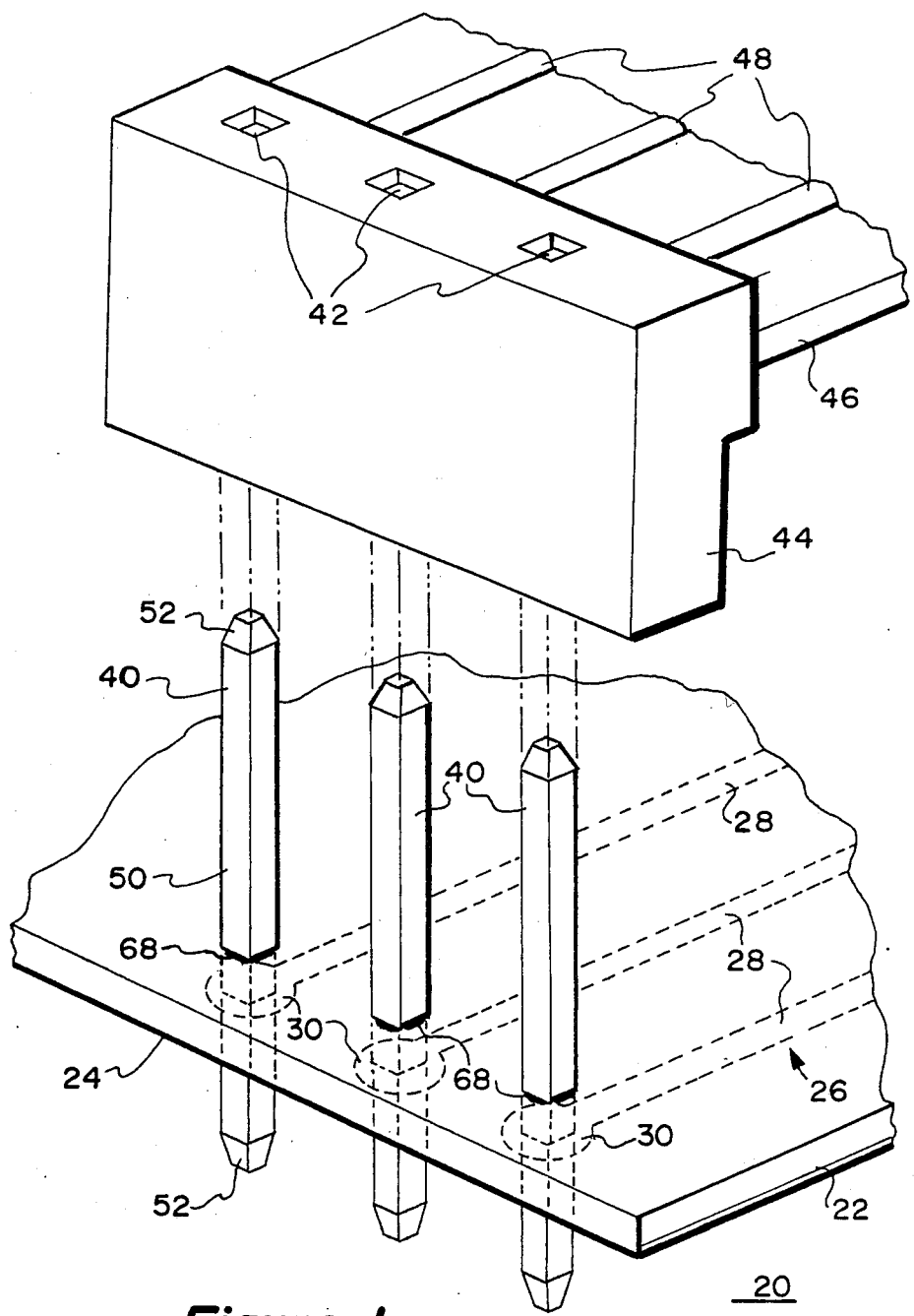
Figure 2:
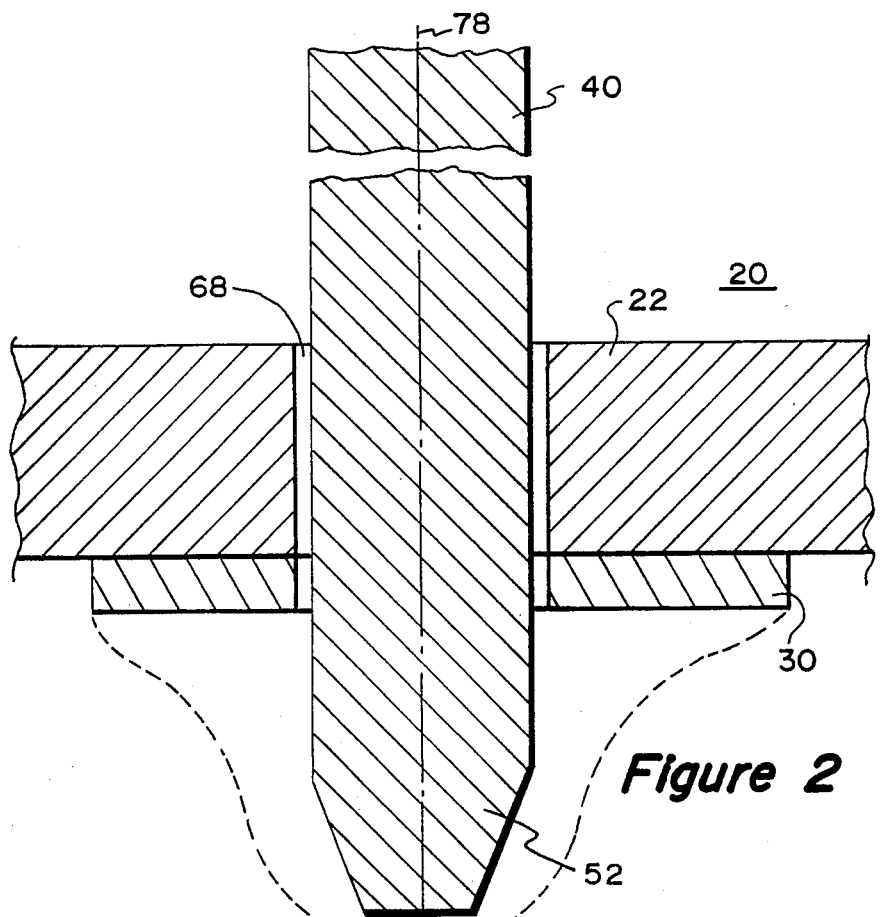
Figure 3:
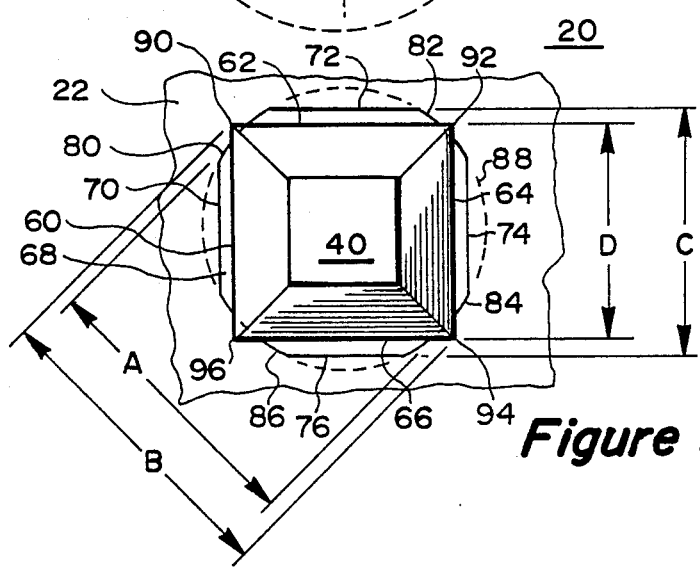

FIGS. 1–3 illustrate a printed circuit board 20 comprising a substrate 22. The substrate 22 may be made from a suitable non-conductive material—such as fiberglass. Disposed on the underside 24 thereof are a plurality of conductive elements 26—for example, conductive tracks 28 and conductive pads 30. The conductive elements 26 provide electrical connection between the stakes 40 and other circuit elements disposed on the PCB.

The PCB 20 is equipped with a plurality of square connector stakes 40. The stakes 40 are received in the respective conductor-engaging slots 42 provided in a connector 44. The connector 44 is, in turn, attached to one end of a ribbon cable 46. When the connector 44 is slipped over the stakes 40, the circuit elements on the PCB 20 are electrically coupled with external system components via the ribbon cable 46.

The connector stakes 40 have flat longitudinal faces 50 and pointed ends 52. The pointed ends 52 facilitate insertion of the stakes into the holes in the PCB 20.

The square cross-section of the connector stakes 40 is defined by a set of four linear sides 60, 62, 64, 66, which are disposed ar right angles to each other. Typically, the square connector stakes 40 are about ⅝" long and have a flat-to-flat thickness of about 0.044" to 0.046". The diagonal or corner-to-corner spacing of the connector stakes 40 is about 0.055" to 0.058".

It will be noted that although this invention is described and illustrated herein in the context of square connector stakes, it is equally applicable for use with connector stakes having a rectangular cross-section.

The PCB 20 is further provided with a plurality of through, connector stake holes 68 for receiving respective stakes 40. The through holes 68 are arranged such that each of the holes is encircled by the respective one of the conductive pads 30 disposed on the underside of the PCB 20. The holes 68 are simultaneously punched in the PCB 22 with a suitable piece of machinery—such as a hydraulic press.

The through holes 68, pursuant to this invention, are provided with a cross-section, which is bounded by two pairs of oppositely-disposed linear edges 70, 74 and 72, 76, and two pairs of oppositely-disposed chamfered edges 80, 84 and 82, 86 as shown in FIG. 3. Basically, the cross-section of the through holes 68 substantially conforms with the cross-section of the stakes 40, except for the chamfered edges 80–86. That is for a square stake, the hole is substantially square, and for a rectangular stake, the hole is substantially rectangular.

The chamfered edges 80–86 may be either linear or curvilinear. In this particular embodiment, the chamfered edges 80, 82, 84 and 86 of the connector stake holes 68 lie along a common circle 88 (shown by dotted lines in FIG. 3) having an axis that coincides with the longitudinal axis 78 of the connector stake holes.

The through holes 68 are dimensioned such that the spacing "A" between the oppositely-disposed chamfered edges 80, 84 and 82, 86 (e.g., 0.050" to 0.052") is less than the spacing "B" between the oppositely-disposed corners 90, 94 and 92, 96 of the stakes 40 (e.g., 0.055" to 0.058"). The chamfered edges 80–86 are designed to provide mechanical interference substantially equal to the mechanical interference currently provided between square stakes inserted in the conventional round holes.

The through holes 68 are further dimensioned such that the spacing "C" between the oppositely-disposed linear edges 70, 74, and 72, 76 of the holes (e.g., 0.046" to 0.048") is equal to or greater than the spacing "D" between the oppositely-disposed sides 60, 64 and 62, 66 of the stakes (e.g., 0.044" to 0.046"). The lack of interference between the sides 60, 62, 64 and 66 of the stakes 40 and the respective linear edges 70, 72, 74 and 76 of the holes 68 prevents the PCB 20 from developing cracks when the stakes are driven into the PCB.

The spacing "C" between the oppositely-disposed linear edges 70, 74 and 72 and 76 of the connector holes 68 (e.g., 0.046" to 0.048") is, on the other hand, less than the spacing "A" between the oppositely-disposed chamfered edges 80, 84 and 82, 86 thereof (e.g., 0.050" to 0.052"). This limits the flux from wicking up along the sides of the stakes 40.

As previously indicated, a problem with the round connector stake holes is that the non-conductive flux has a tendency to wick up through the gap between the flat sides of the stakes and the circular walls of the holes. This leads to contamination of the upper parts of the stakes, whereby open circuit connections are made.

The novel configuration of the through holes 68, in accordance with this invention, not only provides the desired mechanical interference between the square stakes 40 and the chamfered holes, but it substantially blocks the flux from wicking up to the top side of the stakes.

What is claimed is:

1. A printed circuit board (PCB) for use with a plurality of substantially rigid, conductive connector stakes having a longitudinal body portion with a rectangular cross section bounded by a set of four sides intersecting at the respective corners; said PCB comprising:
    a substantially planar non-conductive substrate member having an equal plurality of through holes for receiving said connector stakes; said non-conductive substrate member being provided with conductive pads encircling each of said through holes therein; said through holes having a substantially octagonal cross-section defined by two pairs of oppositely-disposed side walls and two pairs of oppositely-disposed corner walls; said through holes being dimensioned to receive said connector stakes without substantial mechanical interference between said sides of said connector stakes and the respective adjacent side walls of said through holes, and to produce mechanical interference between said corners of said connector stakes and the associated adjacent corner walls of said through holes, when said connector stakes are inserted into said holes with said sides thereof disposed parallel to said respective side walls of said holes; said interference serving to mechanically secure said connector stakes to said PCB.

2. The PCB set forth in claim 1 wherein said through holes are dimensioned so that the spacing between said side walls of said through holes and said sides of said connector stakes.

3. A printed circuit board assembly comprising:
    one or more substantially rigid, conductive connector stakes having a longitudinal body portion with a rectangular cross-section bounded by a set of four sides intersecting at the respective corners; and
    a substantially planar and non-conductive printed circuit board (PCB) having an equal number of conductive pads with through holes provided therein for receiving said connector stakes; said through holes in said PCB having a substantially octagonal cross-section defined by two pairs of oppositely-disposed side walls and two pairs of oppositely-disposed corner walls; wherein said through holes are dimensioned such that the diagonal spacing between said corner walls of said holes is less than the corner-to-corner spacing of said connector stakes in order to provide mechanical interference between said corners of said connector stakes and said corner walls of said holes when said stakes are pressed into said holes with said sides of said stakes arranged parallel to the respective side walls of said holes, thereby physically securing said connector stakes to said PCB; wherein said connector stakes are further dimensioned such that the spacing between said oppositely-disposed side walls of said holes is equal to or greater than the spacing between the respective oppositely-disposed sides of said connector stakes, but less than said oppositely-disposed corner walls of said holes, so that said connector stakes can be received in said through holes without substantial mechanical interference between said sides of said connector stakes and said oppositely-disposed side walls of said through holes.

4. A printed circuit board assembly comprising:
    one or more substantially rigid, conductive connector stakes having a longitudinal body portion with a square cross-section bounded by a set of four sides intersecting at the respective corners; and
    a substantially planar, non-conductive printed circuit board (PCB) having an equal number of conductive pads with through holes provided therein for receiving said connector stakes; said through holes in said PCB having a substantially octagonal cross-section defined by two pairs of oppositely-disposed side walls and two pairs of oppositely-disposed corner walls; wherein said through holes are dimensioned such that the diagonal spacing between said corner walls of said holes is less than the diagonal spacing between said corners of said connector stakes in order to provide mechanical interference between said corners of said connector stakes and said corner walls of said holes when said stakes are pressed into said holes with said sides of said stakes arranged parallel to the respective side walls of said holes, thereby physically securing said connector stakes to said PCB; wherein said connector stakes are further dimensioned such that the spacing between said oppositely-disposed side walls of said holes is equal to or greater than the spacing between the respective oppositely-disposed sides of said connector stakes, but less than said oppositely-disposed corner walls of said holes, so that said connector stakes can be received in said through holes without substantial mechanical interference between said sides of said connector stakes and said oppositely-disposed side walls of said through holes.

5. The PCB assembly defined in claim 4 wherein said corner walls of said through holes define a cylindrical surface having a centerline which coincides with the longitudinal axis of said holes.

6. The PCB assembly defined in claim 5 for receiving said square connector stakes with a side-to-side dimension between 0.044" and 0.046".

7. The PCB assembly as defined in claim 6 wherein said spacing between said oppositely-disposed side walls of said through holes is between 0.046" to 0.048".

8. The PCB assembly as defined in claim 5 wherein said spacing between said corner walls of said through holes is between 0.050" to 0.052".

* * * * *